(12) United States Patent
Norimoto et al.

(10) Patent No.: US 7,439,162 B2
(45) Date of Patent: Oct. 21, 2008

(54) METHOD OF DIVIDING WAFER INTO INDIVIDUAL DEVICES AFTER FORMING A RECESSED PORTION OF THE WAFER AND MAKING THICKNESS OF WAFER UNIFORM

(75) Inventors: Ryuji Norimoto, Tokyo (JP); Tadato Nagasawa, Tokyo (JP); Takatoshi Masuda, Tokyo (JP)

(73) Assignee: Disco Corporation, Tokyo (JP)

( * ) Notice: Subject to any disclaimer, the term of this patent is extended or adjusted under 35 U.S.C. 154(b) by 50 days.

(21) Appl. No.: 11/604,210

(22) Filed: Nov. 27, 2006

(65) Prior Publication Data

US 2007/0123002 A1  May 31, 2007

(30) Foreign Application Priority Data

Nov. 29, 2005  (JP) ............................. 2005-343707

(51) Int. Cl.
*H01L 21/46* (2006.01)
(52) U.S. Cl. .......................... 438/464; 438/33; 438/68; 438/113; 438/458; 438/460
(58) Field of Classification Search .................. 438/33, 438/68, 113, 458, 460, 464
See application file for complete search history.

(56) References Cited

U.S. PATENT DOCUMENTS

| | | | | |
|---|---|---|---|---|
| 5,888,883 A * | 3/1999 | Sasaki et al. | ................. | 438/460 |
| 6,294,439 B1 * | 9/2001 | Sasaki et al. | ................. | 438/464 |
| 6,337,258 B1 * | 1/2002 | Nakayoshi et al. | .......... | 438/464 |
| 6,583,032 B1 * | 6/2003 | Ishikawa et al. | ............. | 438/462 |
| 6,803,247 B2 * | 10/2004 | Sekiya | ......................... | 438/33 |
| 6,852,608 B2 * | 2/2005 | Kitamura et al. | ............. | 438/464 |
| 6,869,830 B2 * | 3/2005 | Nanjo | ......................... | 438/113 |
| 7,172,950 B2 * | 2/2007 | Takezoe et al. | .............. | 438/460 |
| 7,232,741 B2 * | 6/2007 | Nagai et al. | .................. | 438/460 |
| 2004/0192012 A1 * | 9/2004 | Takezoe et al. | .............. | 438/460 |
| 2005/0221584 A1 * | 10/2005 | Arai | ............................ | 438/458 |

FOREIGN PATENT DOCUMENTS

JP       2004-319885       11/2004

* cited by examiner

*Primary Examiner*—Andy Huynh
(74) *Attorney, Agent, or Firm*—Wenderoth, Lind & Ponack, L.L.P.

(57) ABSTRACT

The present invention grinds the rear surface side of a device area to form a recessed portion and an annular reinforcement part on the outer periphery of the recessed portion, removes the annular reinforcement part by grinding or cutting the rear surface of the annular reinforcement part so as to give the wafer a uniform thickness, locates the position of streets in the front surface of the wafer by infrared imaging from the rear surface side of the wafer, and after dividing the wafer into individual devices affixes dicing tape to the rear surface of the wafer divided into devices, supports the rear surface of the wafer on a dicing frame and peels a protective member off the front surface of the wafer, thereby enabling the wafer to be supported using ordinary dicing tape while posing no obstacle to device pick-up after division of the wafer.

3 Claims, 10 Drawing Sheets

METHOD OF DIVIDING WAFER INTO INDIVIDUAL DEVICES AFTER FORMING A RECESSED PORTION OF THE WAFER AND MAKING THICKNESS OF WAFER UNIFORM

BACKGROUND OF THE INVENTION

1. Field of the Invention

The present invention relates to a wafer dividing method that separates a wafer into individual devices along streets as separation lines formed in the wafer.

2. Related Art

Conventionally, a wafer on the surface of which a plurality of devices such as ICs, LSIs and the like are formed is separated into individual devices, using a dicing apparatus or the like, that are widely used in a variety of electronic devices. Then, in an effort to make electronic devices compact and lightweight, prior to separation into individual devices the wafer is placed upside down and secured on a holding table of a grinding apparatus and its rear surface side is ground so as to give the wafer a thickness of, for example, 20-100 μm (see, for example, JP-A-2004-319885).

However, a wafer formed thin by grinding bends like paper, which makes such a wafer both difficult to handle in later processing steps as well as easy to damage. Consequently, the applicant has proposed a technology that involves grinding only that portion which corresponds to a device area so as to form a recessed portion in the rear surface side of the wafer, and forming on the outer periphery of the wafer an annular reinforcement part having a thickness that is the same as before grinding (JP-A-2005-165395).

However, when locating the streets formed on the front surface of the wafer and dividing the wafer into individual devices by cutting them out from the front surface side, it is necessary to affix dicing tape to the rear surface side of the wafer and fix it to a dicing frame to the outermost periphery of which dicing tape is affixed, which creates a difference in height between the outer periphery margin and the recessed portion in the rear surface side of the wafer. As a result, in order to absorb that difference in height at the dicing tape, the dicing tape must be formed to a special shape and ordinary dicing tape cannot be used. Therefore, although it is desirable to affix dicing tape to the rear surface side of the wafer and support it with the dicing frame and cut along the streets from the rear surface side so as to divide the wafer into devices, after the wafer is divided into devices, it is necessary to push the devices with a pin from the rear surface side of the devices so as to pick up the devices from the dicing tape. As a result, ultimately, it is necessary to affix dicing tape to the rear surface side of the wafer.

SUMMARY OF THE INVENTION

Accordingly, the technical problem that the present invention attempts to solve is, in a wafer in which a recessed portion is formed in the rear surface and there is a difference in height between the recessed portion and an annular reinforcement part, enabling the wafer to be supported using ordinary dicing tape while posing no obstacle to device pick-up after division of the wafer.

The present invention provides a wafer dividing method for dividing into individual devices a wafer whose front surface is divided into a device area in which a plurality of devices are divided by streets and formed and a peripheral margin area surrounding the device area, the wafer dividing method comprising a recessed portion forming step of affixing a protective member to the front surface of the wafer, grinding the rear surface side of the device area to form a recessed portion, and forming an annular reinforcement part that includes a peripheral margin area on the outer periphery of the recessed portion; a uniform thickness processing step of removing said annular reinforcement part by grinding the rear surface of said annular reinforcement part or cutting away said annular reinforcement part so as to give said wafer a uniform thickness; a street position location step of locating the positions of the streets formed on the front surface of the wafer by infrared imaging from the rear surface side of the wafer, a division step of cutting along the streets located in the street position location step from the rear surface side of the wafer and dividing the wafer into individual devices; and a dicing frame support step of affixing dicing tape to the rear side of the wafer divided into devices, supporting the wafer with a dicing frame, and peeling the protective member off the front surface of the wafer.

A metal layer coating step of coating the rear surface of the wafer with a metal layer may be carried out between the recessed portion forming step and the uniform thickness processing step, wherein the rear surface of the annular reinforcement part is ground and the metal layer deposited on the rear surface of the annular reinforcement part is removed in the uniform thickness processing step, and the positions of the streets formed on the surface of the wafer are located by infrared imaging from the rear surface of the annular reinforcement part in the street position location step. In addition, a test step of conducting tests of the devices may be carried out between the metal layer coating step and the uniform thickness processing step.

The present invention gives the wafer a uniform thickness by either grinding the rear surface of the annular reinforcement part so as to make it flush with the rear surface of the wafer or by cutting away the annular reinforcement part in the uniform thickness processing step, thus enabling dicing tape to be affixed to the entire rear surface in a state in which the rear surface of the wafer is exposed after the wafer has been divided into devices. Therefore, device pick-up can be carried out smoothly. In addition, the dicing tape is affixed after the wafer has been divided into devices, which causes stress to be dispersed during affixation and makes it more difficult to damage the devices compared to dividing after affixing the dicing tape.

In addition, in a case in which the rear surface of the wafer is coated with a metal layer after the recessed portion is formed, the metal layer deposited on the annular reinforcement part is removed when the wafer is given a uniform thickness, thus enabling infrared rays to penetrate from the rear surface of the wafer to the front surface when locating the positions of the streets and thereby enabling the streets on the front surface to be located and the wafer to be divided into individual devices by cutting or the like from the rear surface side of the wafer.

Other features and advantages of the present invention will be apparent from the following description when taken in conjunction with the accompanying drawings, in which like reference characters designate the same or similar parts throughout the figures thereof.

DETAILED DESCRIPTION OF THE PREFERRED EMBODIMENTS

A detailed description will now be given of a preferred embodiment of the present invention, with reference to the accompanying drawings.

Figure 1:
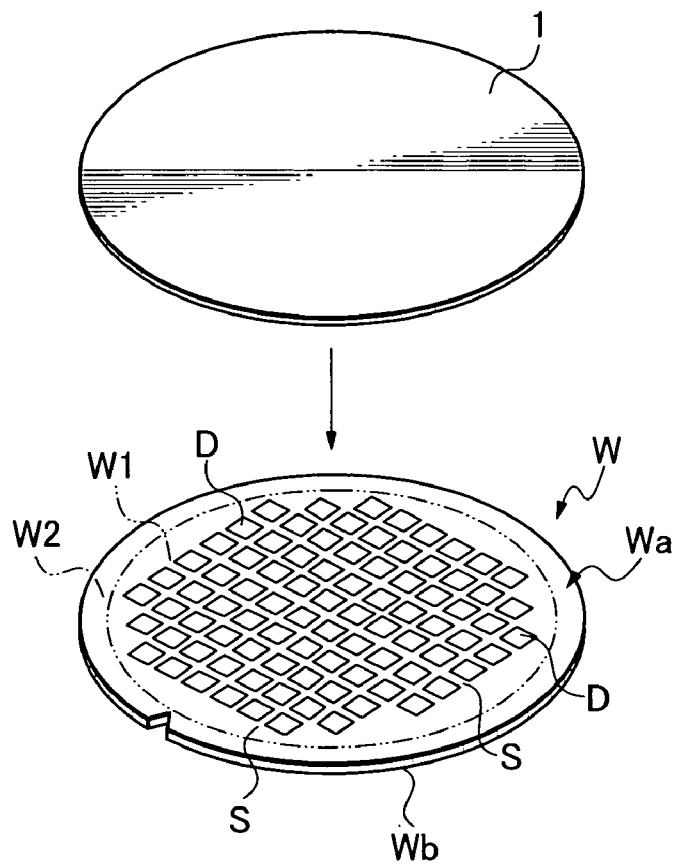
FIG. 1 is a perspective view showing a wafer and a protective member.
Figure 2:
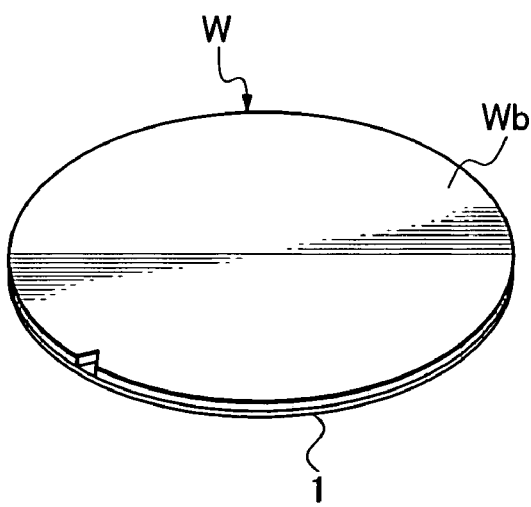
FIG. 2 is a perspective view showing a state in which the protective member is affixed to the front surface of the wafer.

As shown in FIG. 1, a plurality of devices D divided by streets S is formed on a front surface Wa of a wafer W, with the portion in which the devices D are formed itself forming a device area W1. An annular peripheral margin area W2 is formed on the outer periphery of the device area W1, with the device area W1 surrounded by the peripheral margin area W2. A protective member 1 such as tape for protecting the devices D is affixed to the front surface Wa of the wafer, producing the state shown in FIG. 2.

Figure 3:
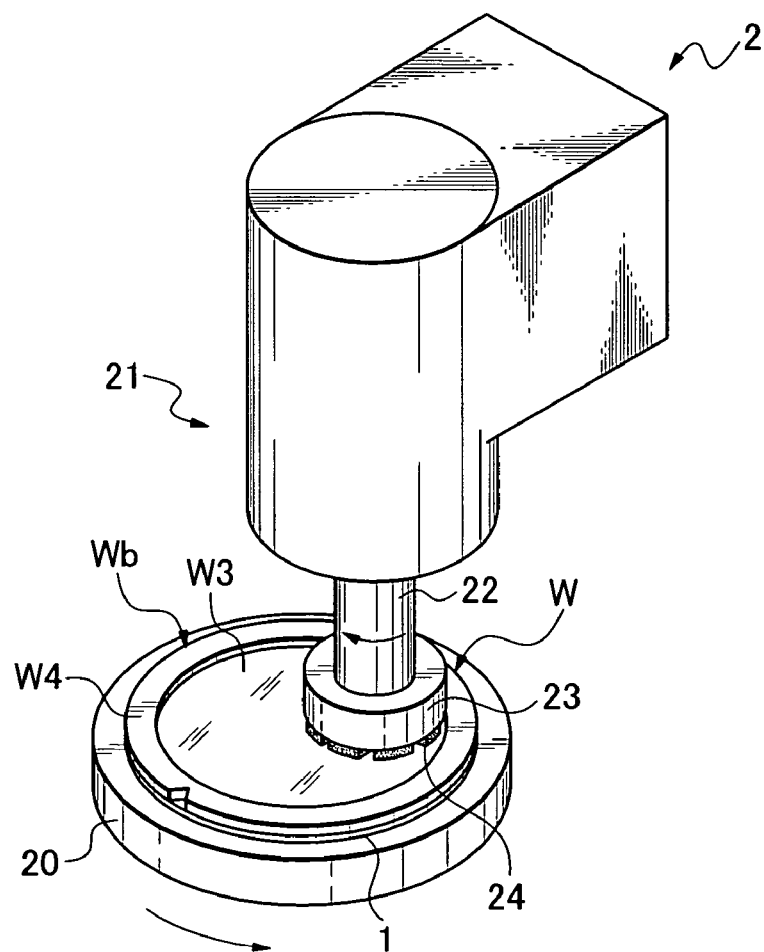
FIG. 3 is a perspective view showing an example of a recessed portion forming step.

Next, a portion of the rear surface Wb of the wafer W that corresponds to the device area W1 on the front surface of the wafer W, in other words the rear side of the device area W1, is ground to a desired thickness. Such grinding may be accomplished using, for example, a grinding apparatus 2 like that shown in FIG. 3.

Figure 4:
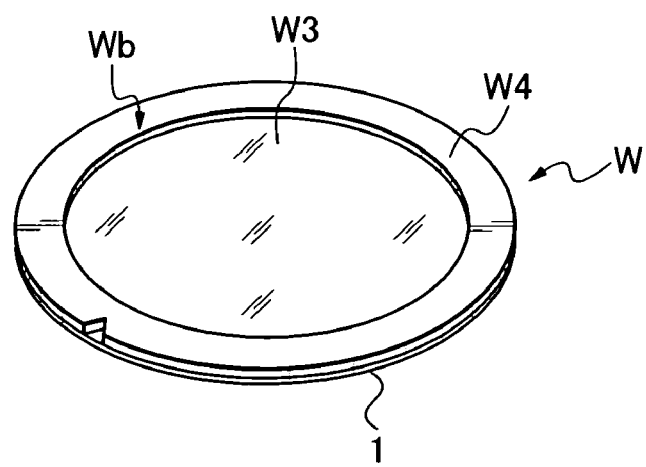
FIG. 4 is a perspective view showing a wafer in which the recessed portion and an annular reinforcement part are formed and the protective member is affixed.
Figure 5:
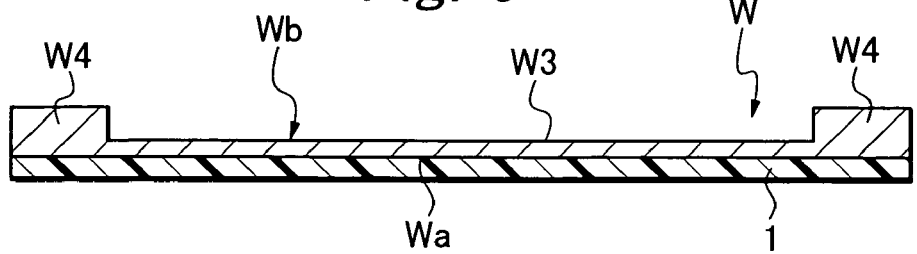
FIG. 5 is a sectional view showing of the wafer in which the recessed portion and an annular reinforcement part are formed and the protective member is affixed.

The grinding apparatus 2 has a chuck table 20 that holds the wafer and a grinding part 21 that actually grinds the wafer held by the chuck table 20. The grinding part 21 is composed of a spindle 22 whose axis is in the vertical direction, a wheel 23 attached to the bottom end of the spindle 22, and a wheel segment 24 fixedly mounted on the bottom surface of the wheel 23. The wafer W is supported on its protective member 1 side by the chuck table 20, putting the rear surface Wb in an exposed state. Then, as the chuck table 20 rotates, the grinding part 21 descends while the wheel 23 rotates, causing the wheel segment 24 to contact the rear surface Wb of the wafer W and pass through the axis of rotation of the rear surface Wb of the wafer W without passing through the peripheral margin area W2. At this time, the wheel segment 24 contacts the rear side of the device area W1 formed on the front surface Wa of the wafer W (see FIG. 1) and the outer periphery is not ground. Then, once the rear side of the device area W1 is ground to a desired thickness, grinding is ended. Thus, by grinding only the rear side of the device area W1 of the rear surface Wb, a recessed portion W3 is formed in the rear surface Wb as shown also in FIG. 4 and FIG. 5, on the outer periphery of which an annular reinforcement part W4, including the peripheral margin area W2 and having a thickness that is the same as that before grinding, remains (recessed portion processing step). The annular reinforcement part W4 may have a width, for example, of approximately 2-3 mm. In addition, preferably, the thickness of the annular reinforcement part W4 is several hundred μm. By contrast, the thickness of the device area W1 can be approximately 30 μm.

Figure 6:
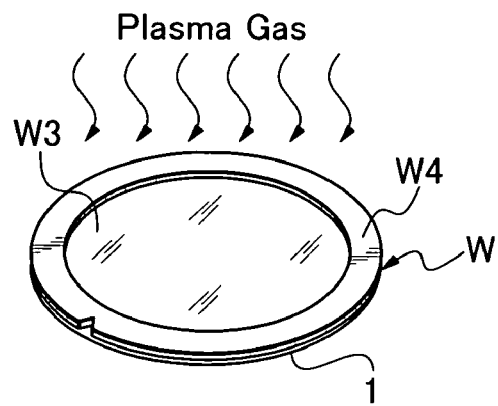
FIG. 6 is a perspective view showing of an example of distortion removal.

Grinding distortions appear in the ground surface of the rear surface Wb in the recessed portion processing step, and therefore it is desirable, as shown in FIG. 6, to plasmatize fluorocarbon gas and carry out dry etching in order to remove distortions in the ground surface (distortion removal step). Conducting the distortion removal step enables the die strength of the devices after division to be increased.

Figure 7:
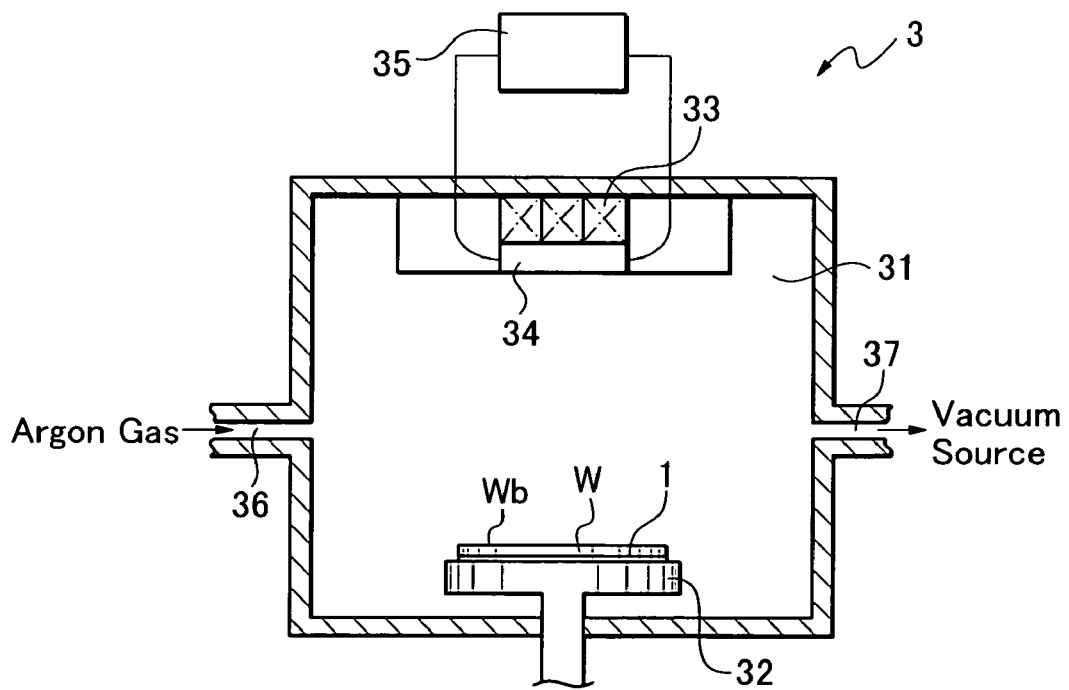
FIG. 7 is a sectional view schematically showing an example of a vacuum deposition device.

After the grinding distortions have been removed, a metal layer composed of gold, silver, titanium or the like may be formed on the rear surface Wb of the wafer W (metal layer coating step). A vacuum deposition device 3 like that shown in FIG. 7 can be used in the metal layer formation step. The low pressure layer deposition apparatus 3 is composed of a holding part 32 that holds the wafer W electrostatically within a chamber 31 and a metal sputter source 34 supported by a magnetization member 33 at a position above and opposite the holding part 32. A high-frequency power source 35 is coupled to the sputter source 34. In addition, an intake port 36 that introduces a sputter gas is provided on one lateral side of the chamber 31 and a vacuum port 37 that communicates with a vacuum source is provided at another lateral side.

Figure 8:
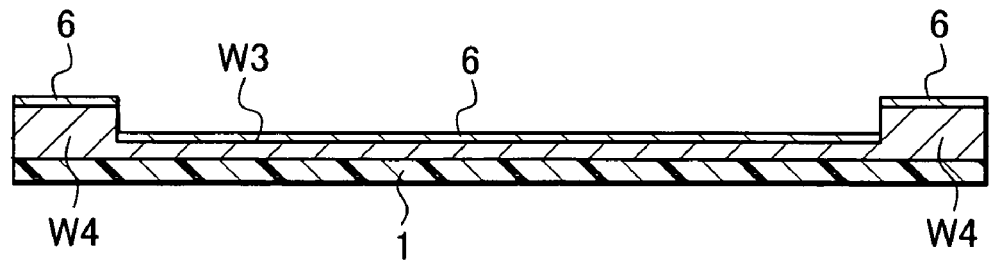
FIG. 8 is a sectional view showing a wafer in which a metal layer is formed on the rear surface and the protective member is affixed to the front surface.
Figure 9:
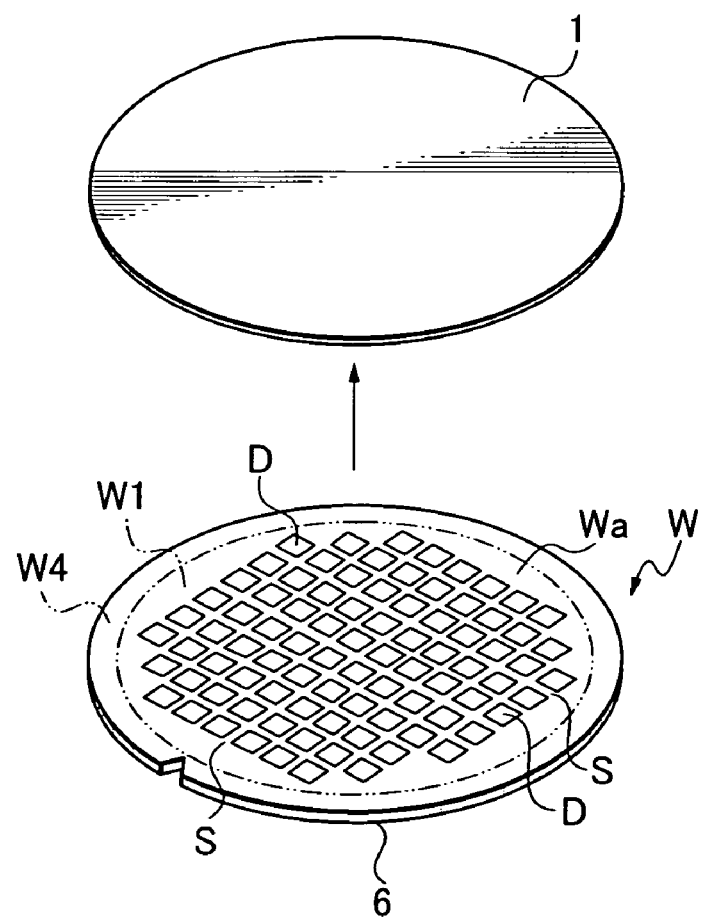
FIG. 9 is a perspective view showing of a state of peeling the protective member from the wafer.

The protective member 1 is electrostatically secured to the holding part 32, and therefore the rear surface Wb of the wafer W is held opposite the sputter source 34. High-frequency power of approximately 40 kHz from the high-frequency power source 35 is applied to the sputter source 34 magnetized by the magnetization member 33, the pressure inside the chamber 31 is reduced to approximately $10^{-2}$ Pa-$10^{-4}$ Pa from the vacuum port 37 to create a low-pressure environment and argon gas is introduced into the chamber 31 from the introduction port 36 to generate plasma. The argon ions in the plasma then strike the sputter source 34 and peel off particles that accumulate on the rear surface of the recessed portion W3 and the annular reinforcement part W4 to form a metal layer 6 as shown in FIG. 8. The metal layer 6 has a thickness of, for example, approximately 30-60 nm. Although the layer formation step is performed in a state in which the rear side of the device area W1 has been ground thin, because the annular reinforcement part W4 is formed on the wafer W, the wafer is easy to handle in the layer formation step. As can be appreciated by those skilled in the art, the layer formation step can also be carried out by vapor deposition, CVD or the like.

Figure 10:
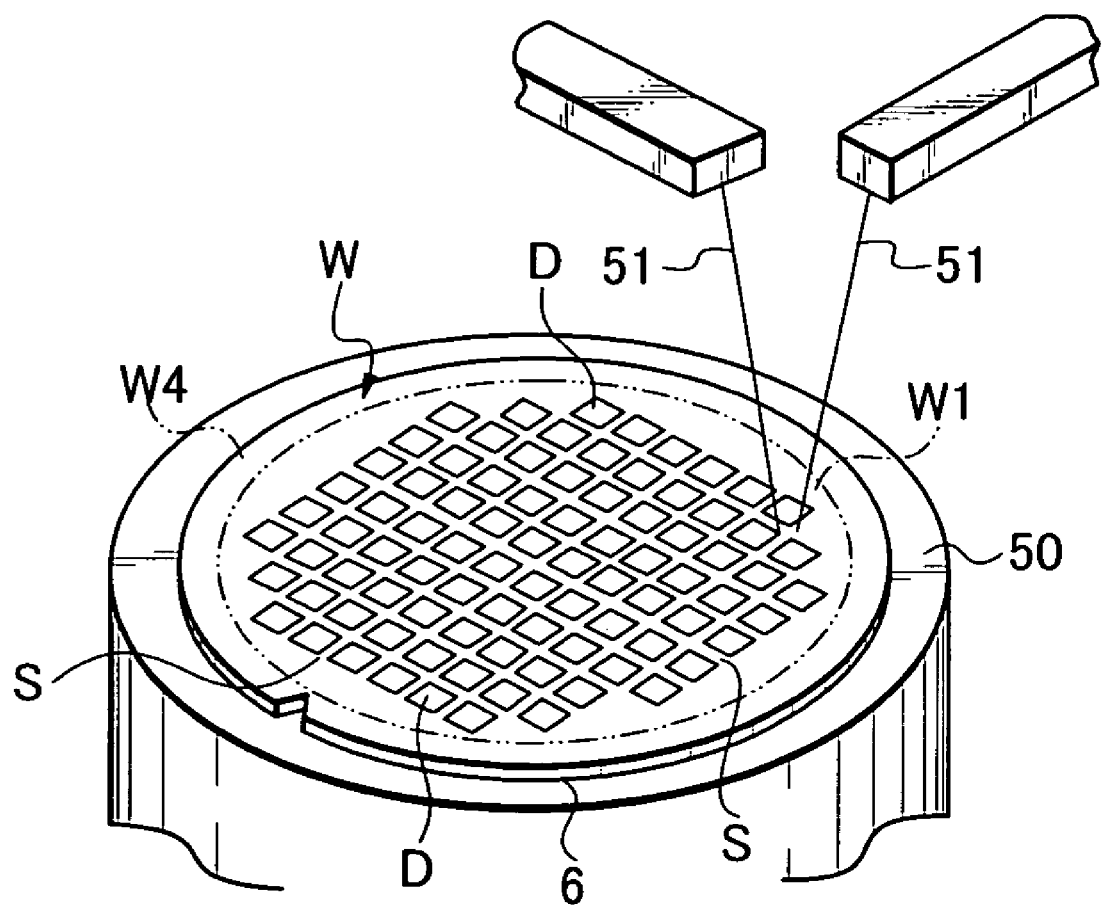
FIG. 10 is a perspective view showing an example of testing.

After the metal layer coating step is completed, the protective member 1 affixed to the front surface Wa of the wafer W is peeled off. Then, as shown in FIG. 10, the wafer W is held at the holding table 50 by the rear surface side on which the metal layer 6 is formed and the holding table 50 is grounded so as to ground the wafer W through the metal layer 6. The electrical characteristics of the devices are then tested by contacting a probe 51 against the rear surface side of the devices D (test step). The wafer W is easy to handle in the test step because the annular reinforcement part W4 is formed on the wafer W.

Figure 11:
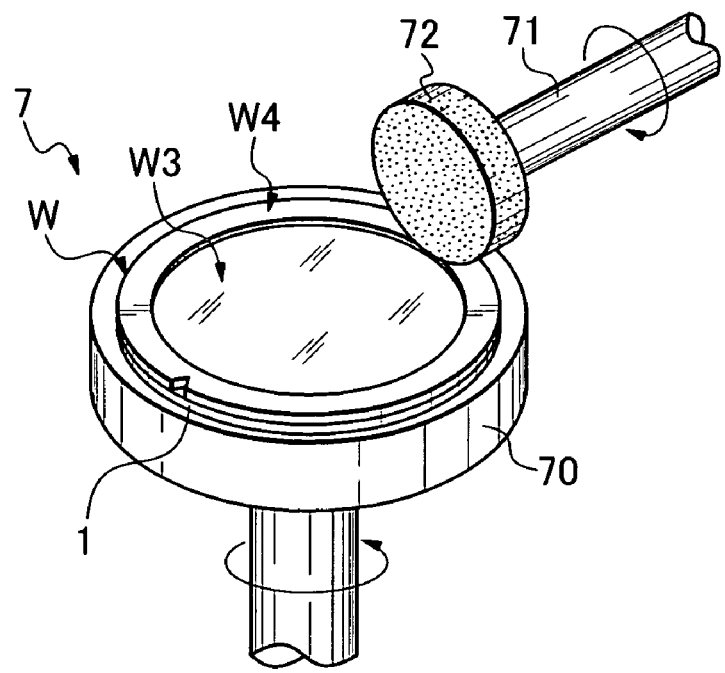
FIG. 11 is a perspective view showing a first example of a uniform thickness processing step.
Figure 12:
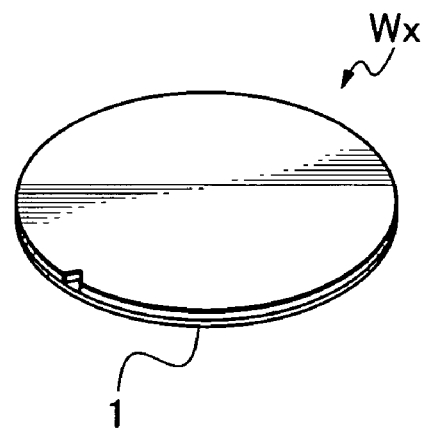
FIG. 12 is a perspective view showing the wafer after completion of the first example of the uniform thickness processing step.

After the test step is completed, the difference in height appearing in the rear surface Wb of the wafer W is eliminated to give the wafer Wa a uniform thickness (uniform thickness processing step). There are two methods of giving the wafer Wa uniform thickness. The first method can be applied to both an instance in which the rear surface Wb of the wafer W is coated with a metal layer and an arrangement in which the rear surface Wb is not coated with a metal layer, and as shown in FIG. 11, involves affixing the protective member 1 to the front surface Wa of the wafer W and securing the protective member 1 side to a holding table 70 of a grinding apparatus 7 so as put the rear surface side in an exposed state. Then, as a disc-shaped whetstone 72 mounted on a spindle 71 and having a thickness of several mm is rotated together with the holding table 70, it is contacted against the rear surface of the annular reinforcement part W4 and the rear surface of the annular reinforcement part W4 is ground until the recessed portion W3 and the annular reinforcement part W4 form the same flush surface, resulting in wafer Wx shown in FIG. 12. At this point, if the rear surface Wb is coated with a metal layer, the metal layer on the rear surface of the recessed portion W3 is removed.

Figure 13:
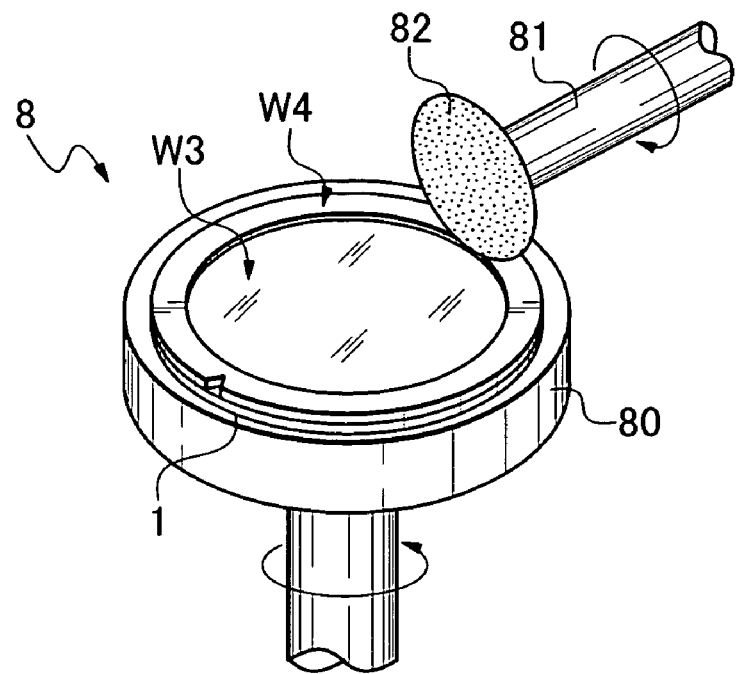
FIG. 13 is a perspective view showing a second example of the uniform thickness processing step.
Figure 14:
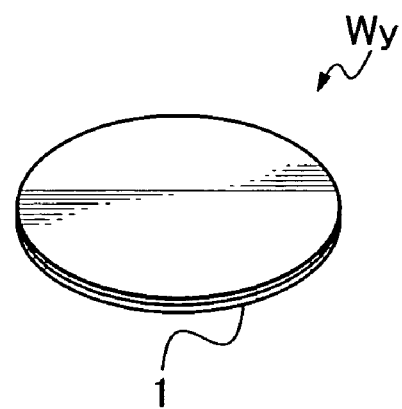
FIG. 14 is a perspective view showing the wafer after completion of the second example of the uniform thickness processing step.

The second method is applied in cases in which the rear surface is not coated with a metal layer, and as shown in FIG. 13, involves affixing the protective member 1 to the front surface Wa of the wafer W and securing the protective member 1 side to a holding table 80 of a cutting apparatus 8 so as to put the rear surface side in an exposed state. Then, as a cutting blade 82 mounted on a spindle 81 is rotated at high speed together with the holding table 80, it is inserted into the inside of the annular reinforcement part W4 so as to cut the protective member 1 together with the wafer W, removing the annular reinforcement part W4 and resulting in the wafer Wy shown in FIG. 14.

Figure 15:
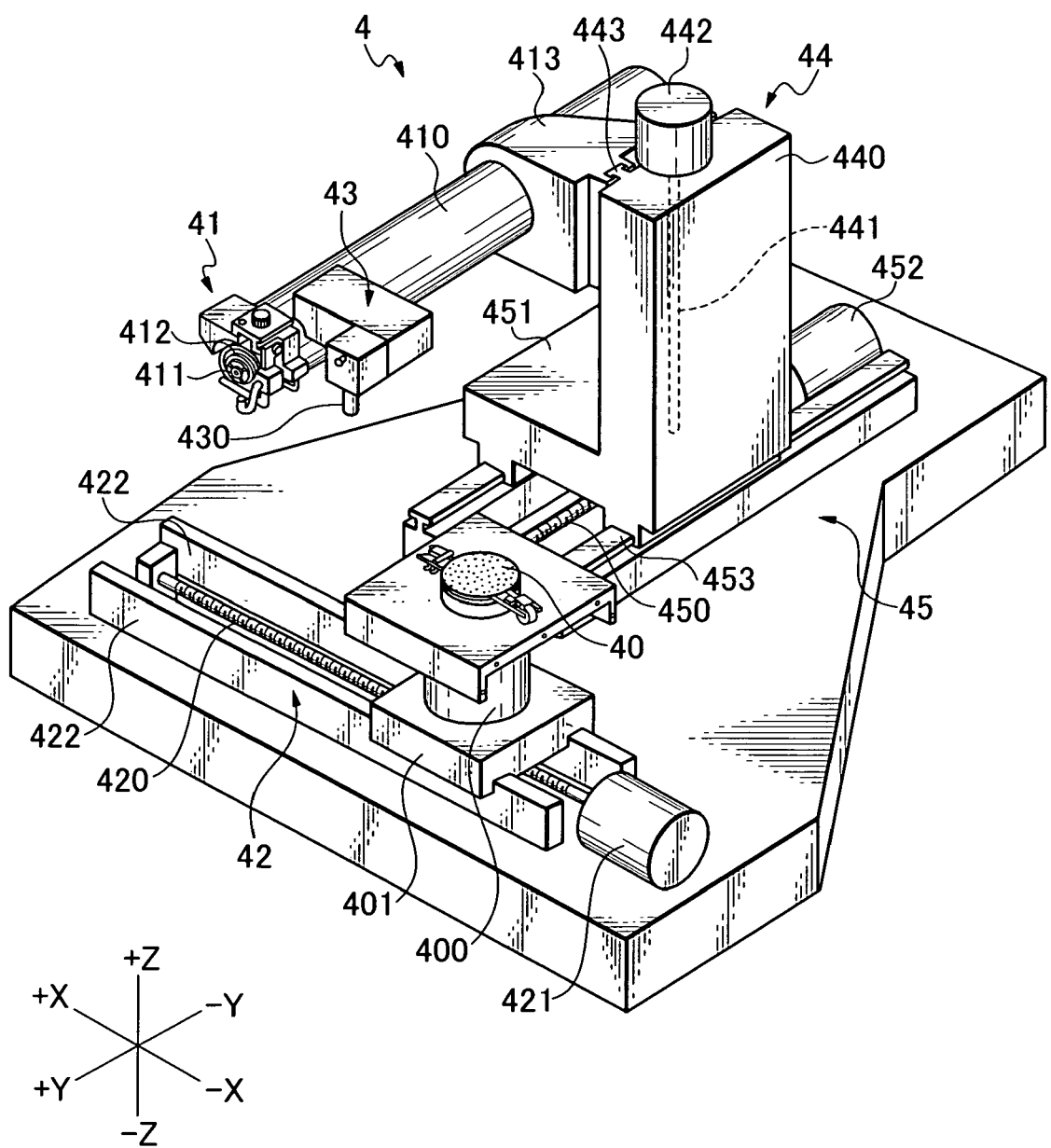
FIG. 15 is a perspective view showing an example of a cutting device.

These wafers Wx, Wy, whose rear surfaces have been flattened and given a uniform thickness, are separated along the streets S formed in the front surface of the wafer W (see FIG. 1) and divided into individual devices D in a state in which the protective member 1 is affixed to the front surface. Although this dividing of the wafer W can also be accomplished by directing a laser beam onto the streets S, here, a description is given of a case in which such division is accomplished by cutting along the streets S using, for example, a cutting apparatus 4 shown in FIG. 15.

The cutting device 4 has a chuck table 40 that holds the wafer W and cutting means 41 that acts on and cuts the wafer W held by the chuck table 40. The chuck table 40 is linked to a drive source 400 and is rotatable. The drive source 400 is fixedly mounted on a moving base 401 and the base 401 is movable in the X-axis direction by cutting feed means 42. The cutting feed means 42 is composed of a ball screw 420 disposed in the X-axis direction, a pulse motor 421 linked to one end of the ball screw 420, and a pair of guide rails 422 disposed parallel to the ball screw 420. A nut, not shown, provided on the bottom of the moving base 401, engages the ball screw 420. The ball screw 420 is driven by the pulse motor 421 and rotates, causing the moving base 401 to move in the X-axis direction guided by the guide rails 422.

The cutting means 41 is composed of a cutting blade 412 attached to the tip of a spindle 411 that is rotatably supported by a housing 410, with the housing 410 supported by a support 413.

Alignment means 43 that detects the wafer streets is fixedly mounted on a lateral side part of the housing 410. The alignment means 43 is equipped with an infrared camera 430 for imaging the wafer W. The streets to be cut can be detected by pattern matching and other processing that matches the images acquired by the infrared camera 430 against pre-stored key patterns. The infrared camera 430 is positioned along the X-axis direction of the cutting blade 412.

The cutting means 41 and the alignment means 43 are movable in the Z-axis direction by a cutting blade insertion feed means 44. The cutting blade insertion feed means 44 is composed of a ball screw 441 disposed in the Z-axis direction in one surface of a wall 440, a pulse motor 442 that rotates the ball screw 441, and a guide rail 443 disposed parallel to the ball screw 441, with a nut, not shown, inside the support 413 engaging the ball screw 441. The support 413 is driven by the pulse motor 442 so as to rotate the ball screw 441 and cause it to ascend in the Z-axis direction guided by the guide rail 443, by which the cutting means 41 supported by the support 413 also ascends and descends.

The cutting means 41 is movable in the Y-axis direction by index feed means 45. The index feed means 45 is composed of a ball screw 450, a moving base 451 that engages the ball screw 450 with an internal nut formed as a single integrated unit with the wall 440, a pulse motor 452 that rotates the ball screw 450, and a guide rail 453 disposed parallel to the ball screw 450, with a nut, not shown, inside the moving base 451 engaging the ball screw 450. The moving base 451 is driven by the pulse motor 452 so as to rotate the ball screw 450 and cause it to move in the Y-axis direction guided by the guide rail 453, by which the cutting means 41 also moves in the Y-axis direction.

The wafers Wx, Wy of uniform thickness are suctionally held in place on the chuck table 40 with the rear surface side exposed and the chuck table 40 is moved in the X-axis direction, causing the annular reinforcement part W4 of the wafer W to be positioned directly beneath the infrared camera 430.

For wafer Wx, if the rear surface is coated with a metal layer, when carrying out infrared imaging using the infrared camera 430 from the rear surface side of the annular reinforcement part W4 using the infrared camera 430, since the metal layer has been removed, the positions of the streets can be determined by passing infrared rays through the interior of the wafer W. For example, of the devices D formed on the front surface of the wafer W (see FIG. 1), since some of those closest to the outer periphery protrude into the peripheral margin area W2, those protruding devices are infrared-imaged and pattern matching is carried out of the target pattern in those devices and the image of the target pattern that is stored in advance in the alignment means 43. Since the distance between the target pattern and the streets is already stored in the alignment means 43, and moreover, the infrared camera 430 is positioned along the X-axis direction of the cutting blade 412, if the alignment means 32 and the cutting means 41 are moved precisely the distance between the pre-stored target pattern and the streets from their positions at the time the target pattern is detected, the streets to be cut and the cutting blade 412 will be aligned in the Y-axis direction (street position location step). It should be noted that even when no devices D protrude into the peripheral margin area W2, if an alignment mark is formed on the outermost periphery of the streets, in other words in the peripheral margin area W2, and if that alignment mark is detected by pattern matching, the streets can be located. By contrast, if the rear surface Wb of the wafer Wx is not coated with a metal layer, the positions of the streets on the front surface side can be located by infrared imaging with the infrared camera from the rear surface of the device area D1 so as to pass infrared rays through the interior of the wafer W. For a wafer WY as well, it is the same as with a wafer Wx whose rear surface is not coated with a metal layer.

After the alignment of the streets and the cutting blade 412 in the Y-axis direction has been carried out, the chuck table 40 is moved in the X-axis direction by the cutting feed means 42, the cutting means 41 is lowered by the cutting blade insertion feed means 44 while the cutting blade 412 is rotated at high speed, the cutting blade 412 is inserted into the detected street and the street is cut.

Figure 16:
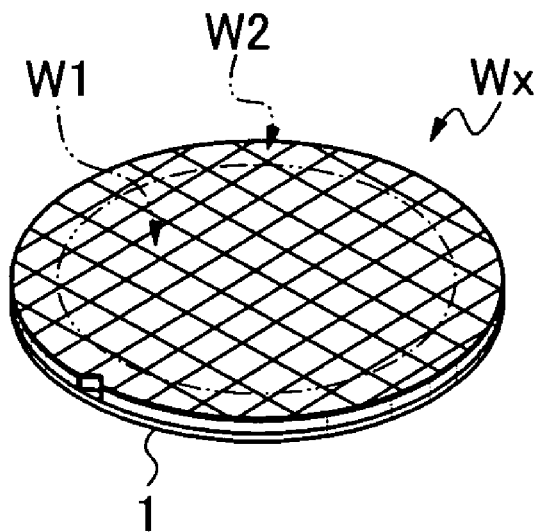
FIG. 16 is a perspective view showing a first example of a wafer after completion of division.
Figure 17:
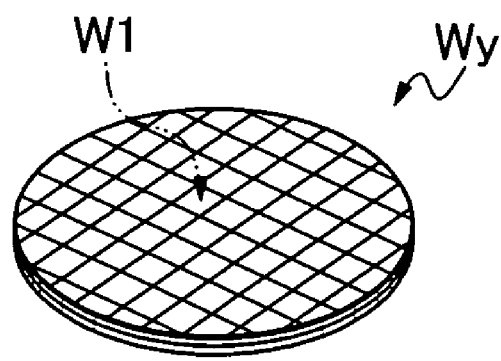
FIG. 17 is a perspective view showing a second example of a wafer after completion of division.

In addition, the cutting means 41 is index fed at intervals between streets by the index feed means 45 and the same cutting is carried out in order until all streets in the same direction are cut. Further, the same cutting is carried out while the chuck table is rotated 90 degrees, so that wafers Wx, Wy are divided into individual devices D (division step). As shown in FIG. 16, the peripheral margin area W2 is also cut along the streets. At this time, the shape of wafer Wx is still maintained by the protective member 1 even after cutting. As for wafer Wy, as shown in FIG. 17, the peripheral margin area W2 has been cut away, and therefore cutting only the device area results in the wafer being divided into individual devices, with the shape of the wafer maintained by the protective member 1.

Figure 18:
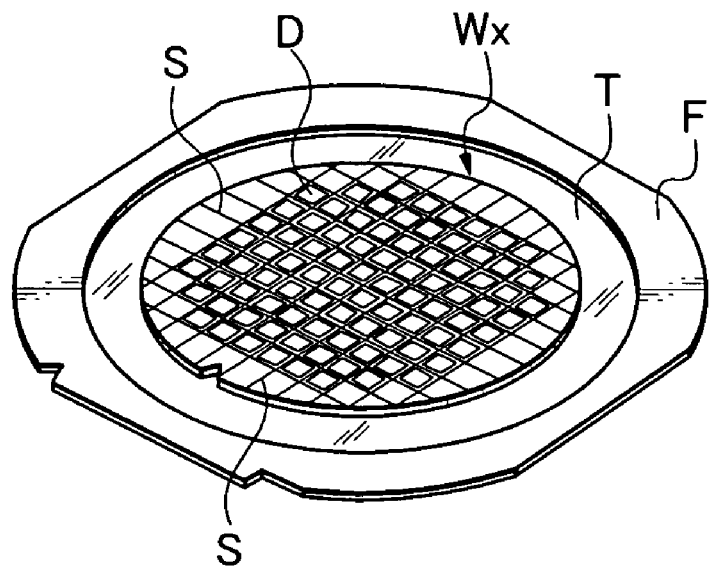
FIG. 18 is a perspective view showing a state in which the wafer of the first example is supported by a dicing frame.
Figure 19:
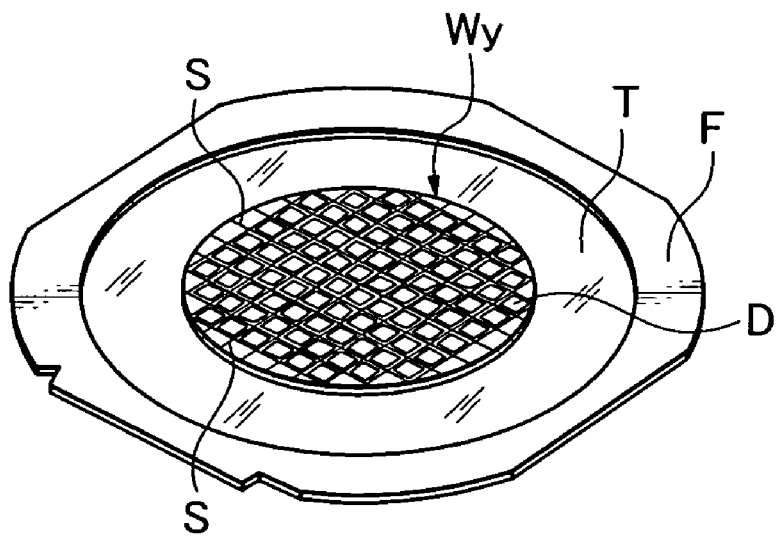
FIG. 19 is a perspective view showing a state in which the wafer of the second example is supported by a dicing frame.

After the division step is completed, in order to pick up the individual devices D, the devices that maintained the shape of the wafers Wx, Wy are affixed to the dicing tape T shown in FIG. 18 and FIG. 19 and the whole is then integrated into and supported by a dicing frame F affixed to the outermost periphery of the dicing tape T. At this time, the rear surface side of the wafers Wx, Wy is affixed to the adhesive side of the dicing tape T. Then, when the protective member 1 is peeled off the front surface to which it had been affixed, as show in FIG. 18 and FIG. 19, the wafers Wx, Wy divided into individual devices D are supported by the dicing frame F via the dicing tape T (dicing frame support step). In this state, the individual devices D are exposed and facing up, and moreover, their rear surfaces have been flattened and the entire rear surface is affixed to the dicing tape T. Therefore, from the rear side of the dicing tape T it is possible to push the rear surface sides of the devices D with a pin or the like, which makes it possible to pick up the devices D from the dicing tape T.

As many apparently widely different embodiments and variations of the present invention can be made without departing from the spirit and scope thereof, it is to be understood that the present invention is not limited to the specific embodiments thereof described herein but rather only to the extent set forth in the following claims.

What is claimed is:

1. A wafer dividing method for dividing into individual devices a wafer whose front surface is divided into a device area in which a plurality of devices are divided by streets and formed and a peripheral margin area surrounding the device area, the wafer dividing method comprising:
   a recessed portion forming step of affixing a protective member to the front surface of the wafer, grinding a rear surface side of said device area to form a recessed portion, and forming an annular reinforcement part that includes a peripheral margin area on an outer periphery of said recessed portion;
   a uniform thickness processing step of removing said annular reinforcement part by grinding a rear surface of said annular reinforcement part or cutting away said annular reinforcement part so as to give said wafer a uniform thickness;
   a street position location step of locating positions of said streets formed on the front surface of the wafer by infrared imaging from the rear surface side of said wafer;
   a division step of cutting along the streets located in said street position location step from the rear surface side of the wafer and dividing the wafer into individual devices; and
   a dicing frame support step of affixing dicing tape to the rear side of the wafer divided into devices, supporting the wafer with a dicing frame, and peeling said protective member off the front surface of said wafer.

2. The wafer dividing method according to claim 1, further comprising a metal layer coating step, conducted between said recessed portion forming step and said uniform thickness processing step, of coating the rear surface of said wafer with a metal layer, wherein:
   the rear surface of said annular reinforcement part is ground and the metal layer deposited on the rear surface of said annular reinforcement part is removed in said uniform thickness processing step; and
   the positions of the streets formed on the surface of the wafer are located by infrared imaging from the rear surface of said annular reinforcement part in said street position location step.

3. The wafer dividing method according to claim 2, further comprising a test step, conducted between said metal layer coating step and said uniform thickness processing step, of conducting tests of the devices.

* * * * *